United States Patent [19]
Bates

[11] Patent Number: 4,522,193
[45] Date of Patent: Jun. 11, 1985

[54] SOLAR COLLECTOR DEVICE

[76] Inventor: Kenneth N. Bates, 27765 Lupine Rd., Los Altos Hills, Calif. 94022

[21] Appl. No.: 585,660

[22] Filed: Mar. 2, 1984

Related U.S. Application Data

[62] Division of Ser. No. 365,946, Apr. 6, 1982, Pat. No. 4,473,065, which is a division of Ser. No. 203,258, Nov. 3, 1980, abandoned.

[51] Int. Cl.³ ................................................. F24J 3/02
[52] U.S. Cl. ......................................... 126/438; 165/96
[58] Field of Search ........................ 126/438, 439, 440; 165/32, 96; 350/293, 296

[56] References Cited

U.S. PATENT DOCUMENTS

| 3,134,906 | 5/1964 | Henker | 126/438 X |
| 4,150,663 | 4/1979 | Sisson | 126/438 |
| 4,167,936 | 9/1979 | Hackworth | 126/438 |

Primary Examiner—Randall L. Green
Attorney, Agent, or Firm—Joseph H. Smith; Ronald E. Grubman

[57] ABSTRACT

A solar collector is provided in which a focussing element precisely focusses solar radiation upon a collecting region of a collecting element during all times of the day, without necessitating daily motion of the focussing element. The collecting region is constructed to be more highly absorbing of the solar radiation than any other region of the collector which might be in thermal contact with the collecting region.

In some embodiments, the collecting region is a self-defined portion of the collecting element upon which the solar radiation is focussed at any given time. This is achieved by utilizing a collecting element which locally converts incident solar energy to another form of energy in a non-linear manner as a function of incident solar intensity. For example, the collecting element may be fabricated from a photochromic glass which darkens when impinged upon by the focussed radiation of the sun. The collecting region is automatically self-defined by the local darkened region of the photochromic glass, which traverses the collector as the sun traverses the sky.

12 Claims, 16 Drawing Figures

SOLAR COLLECTOR DEVICE

This is a division of application Ser. No. 365,946, filed Apr. 6, 1982, now U.S. Pat. No. 4,473,065, which is a divisional of prior application Ser. No. 203,258 filed Nov. 3, 1980, now abandoned.

BACKGROUND OF THE INVENTION

This invention relates generally to devices for collecting and storing solar radiation, and particularly to a solar collector of the type in which solar radiation is focussed onto a light absorbing surface.

Prior art solar collectors of the focussing type have been known for many years. Examples of such collectors, utilizing lenses, are given in U.S. Pat. Nos. 3,929,121, 3,981,295, and 4,137,899. Each of these patents discloses a system in which a flat lens or a Fresnel lens focusses solar radiation upon a conduit containing a working fluid. Typical systems of this type are unable to maintain continuous focussing of the sun's rays upon the conduit without complicated and expensive tracking equipment. See, for example, the gear and hinge arrangement illustrated in U.S. Pat. No. 3,929,121.

An attempt to solve this problem is discussed in U.S. Pat. No. 4,033,324 which uses a number of spherical lenses focussing the sun's radiation onto a substrate below the lenses. This structure is less than satisfactory, however, since the sun's rays will not be properly focussed upon the underlying substrate, except during a short portion of the day when the angle of incidence of the sun's rays properly corresponds to the particular distance of the substrate from the center of the spherical lens.

Another patent disclosing a panel of spherical lenses is U.S. Pat. No. 2,277,311. In this reference, hemispherical lenses focus the sun's rays onto a set of opposing hemispherical lenses which diffuse the rays onto a substrate. Although this device will collect radiation from the sun over a large portion of the day, there does not appear to be any effective focussing of the rays onto a collector.

A more interesting approach is taken in U.S. Pat. No. 1,093,498, in which focussing is accomplished using a number of spherical lenses, each positioned above a hemispherical collecting cup. Since the collecting cup is concentric with the spherical lens, the sun's rays will be focussed on some portion of the interior of the cup during the entire day. However, the collecting cups are fabricated from metallic radiating cases which both absorb and re-radiate heat through the lens; the device is therefore inefficient as a solar collector.

In U.S. Pat. No. 3,587,559, a similar configuration is disclosed in which the interior of the collecting cup is lined with a carbon impregnated cloth to increase the absorption of solar radiation thereon. Again, however, the net efficiency on the device is not increased since the collector will re-radiate from all portions of the darkened cup back through the spherical lens.

SUMMARY OF THE INVENTION

In accordance with the illustrated preferred embodiments, the present invention provides a solar collector including a focussing element which precisely focusses solar radiation upon a collecting region of a collecting element during all times of the day, without necessitating daily motion of the focussing element. The collecting region is constructed to be more highly absorbing of the solar radiation than any other regions of the collector.

In some preferred embodiments, the focussing element is a spherical lens, while the collecting element is an arc-shaped conduit concentric with the spherical lens and containing a working fluid.

In other embodiments, the focussing element is a hollow reflecting hemisphere, reflecting the sun's rays onto different portions of a semi-circular collecting element during the day.

In some embodiments, the collecting element may be a collecting cup having a darkened striplike region in the interior of the cup, or the collecting region may be a thermoelectric of thermoionic converter.

In accordance with yet other aspects of the invention, the collecting region is a self-defined portion of the collecting element. For example, the collecting element may be fabricated from a material having non-linear absorbing properties as a function of the intensity of radiation incident thereon. Such a material is, e.g., a photochromic glass, which darkens when impinged upon by the focussed radiation of the sun. In embodiments exploiting this aspect of the invention, the collecting region is automatically self-defined by the local darkened region of the photochromic glass, which traverses the collector as the sun traverses the sky. Alternatively, the non-linear conversion of solar energy to electrical energy as a function of incident solar flux may be exploited in accordance with the invention by providing a collecting element which includes an array of solar cells positioned so that the focussing element focusses upon different cells at different times of day.

Further embodiments exploit heat transfer properties which are non-linear functions of temperature (and hence of incident solar intensity) to produce an effective heat transfer to and from the working fluid of the collector only in the local region upon which the sun's rays are focussed. For example, the collecting element may be fabricated of a semiconductor material whose thermal conductivity is a non-linear function of temperature. Alternatively, an array of uni-directional heat pipes subjected to the focussed radiation of the sun may serve as the collecting element. In yet another such embodiment, the collecting element may include a flexible heat conducting strip having a moving "dimple" which follows the focussed solar radiation to provide heat transfer.

DESCRIPTION OF THE INVENTION

Figure 1:
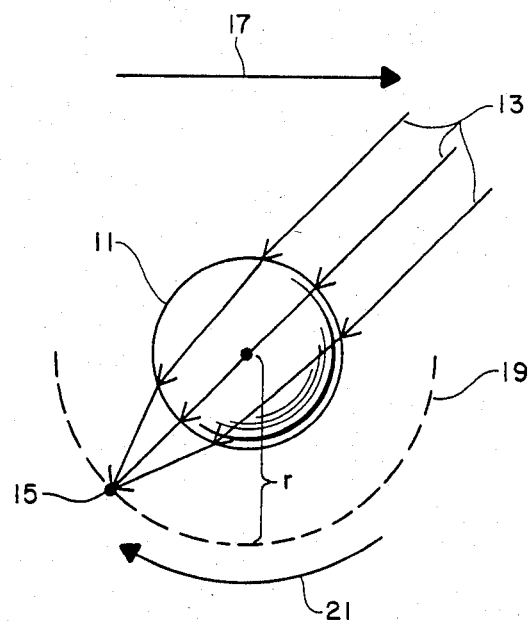
FIG. 1 illustrates a spherical lens focussing the sun's rays upon a spot on a focussing circle.

To facilitate discussion of the various embodiments of the invention, the same label will be used to designate corresponding elements in the various figures. In FIG. 1, there is shown a spherical lens 11, for example, of glass or plastic. Such a spherical lens has the property of focussing parallel rays of light from the sun, such as those collectively labeled 13, onto a focal spot 15. As the sun moves across the sky during the day as indicated by the arrow 17, the focal spot 15 will move oppositely around a focal arc 19 (concentric with sphere 11), as indicated by the arrow 21. The theoretical radius "r" of curve 19 is given by the equation $$r = R + (2-n)R/(2(n-1))$$

where R is the radius of focussing sphere 11 and n is the index of refraction of the focussing sphere, assuming that the medium between sphere 11 and curve 19 has an index of refraction of 1. For different choices of media, the governing equation is different, but may be found in the optics literature. For the case of a heavy flint glass sphere, n equals 1.8 and r equals 1.125R. Of course, in practical structures r will vary slightly from this theoretical value, due to abberation.

Figure 2:
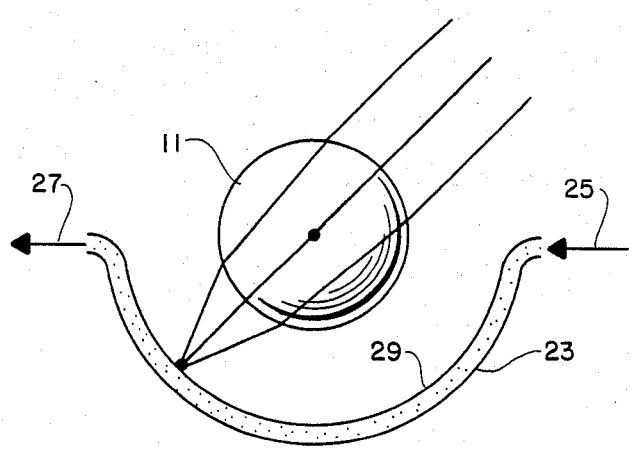
FIG. 2 shows a portion of a solar collector in which a conduit is positioned along the focussing circle.

In FIG. 2, a tubular conducting element 23 is physically positioned near sphere 11 along the arc designated 19 in FIG. 1. A working fluid such as water or oil enters conduit 23 through one opening as indicated by arrow 25, passes through the semi-circular conduit and exits at another opening as indicated by arrow 27. The absorbing surface 29 of conduit 23 is made to be highly absorbing of the radiation focussed on the conduit. For example, surface 29 may be covered with a black material such as "carbon black". As the sun traverses the sky, the concentrated solar radiation will at all times be focussed on some portion of conduit 23, thereby providing a highly efficient means for heating the working fluid passing therethrough. The heated fluid may then be stored and/or employed to produce energy in any of a number of ways commonly known to those skilled in the art. It will be recognized that the system shown in FIG. 2, in which the darkened surface 29 of conduit 23 is positioned along focussing arc 19, constitutes a very efficient way of utilizing radiation from the sun, since at all times during the day the solar radiation is focussed onto some portion of the darkened inner surface 29 of conduit 23.

Figure 3A:
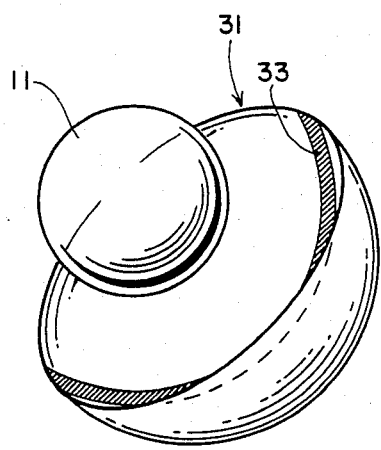
FIGS. 3A and 3B illustrate a portion of a solar collector in which a lens focusses the sun's radiation along a collecting strip lining the interior of the collecting cup.
Figure 3B:
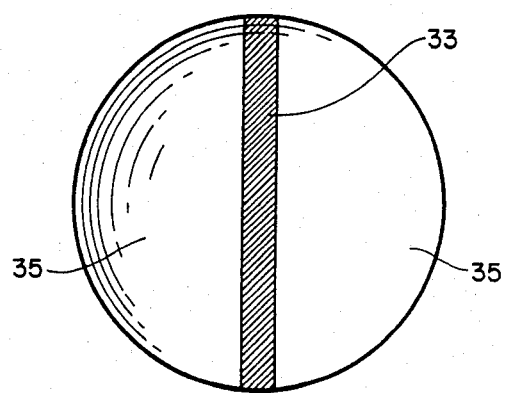

Another preferred embodiment of a solar collector is illustrated, in part, in FIGS. 3A and 3B in which spherical lens 11 is used to focus the sun's rays on a region of a collecting cup 31. The collecting cup is substantially of hemispherical shape having a radius equal to the radius of focussing arc 19 defined above in connection with FIG. 1. A strip-like collecting region 33 may be defined along the interior of collecting cup 31 so that by suitably locating collecting cup 31 with respect to lens 11, strip-like region 33 can be positioned along focussing arc 19 (of FIG. 1). In FIG. 3B, there is shown a top view of collecting cup 31 including such a strip-like region 33 of a light absorbing material such as carbon black. The remaining regions of collecting cup 31 on either side of strip 33 are collectively labeled 35 and are preferably of a reflecting material such as polished aluminum. The shape and width of collecting strip 33 are selected to insure that the sun's rays will be properly focussed on the strip at all times during the year. More particularly, if seasonal adjustment of the collector is not desired, the collection strip must be wide enough so that the focussed solar rays always fall on the collection strip. The sun's arc across the sky goes through its 47° seasonal change in latitude during a yearly cycle. Defining "W" as the width of the collecting strip, it is easy to show that $$W = r\theta_{annual}$$

where r is the focal length of the sphere and $\theta_{annual}$ is the seasonal angular change of the sun's arc (0.82 radians).

The embodiments shown in FIGS. 2, 3A, and 3B illustrate an important aspect of the invention; namely, that there is included in each structure a "collecting region" of the device on some portion of which the rays are focussed at all times as the sun traverses the sky. This collecting region is blackened to provide absorption of the sun's rays, while adjacent regions of the solar collector are made reflective. This tends to maximize the efficiency of the collector, since heat which is transferred to the adjacent non-blackened portions of the collecting element will not be rapidly radiated away, as would be the case if the adjacent regions were also blackened. This is in contradistinction to the solar collector structures shown in U.S. Pat. No. 1,093,498 (Thring) and U.S. Pat. No. 3,587,559 (Nonaka), discussed in the Background of the present specification. In the patent to Thring, the collecting cups are said to be "radiating casings" which will be inefficient collectors, since most of the rays of the sun will be radiated from the collector. As a partial solution to said problem, Nonaka's device includes similar collecting cups which appear to be entirely lined with a carbon black cloth. However, as can be seen from the positioning of the water pipes in Nonaka, heating of the water is dependent upon a general transfer of heat from the entire blackened cup to adjacent elements of the collector. Nonaka has therefore failed to exploit the fact that the sun's rays will be focussed only on a small strip-like portion of the collecting cup during the day. As a consequence, the sun's rays will be absorbed only along a strip-like region of the Nonaka collecting cup, but will be re-radiated back through the lens from all portions of the darkened collecting cup. The device will therefore be highly inefficient relative to a device in accordance with the present invention, in which only the strip-like region of the cup is darkened.

To emphasize this distinction of the presently disclosed structure over those of the prior art, the term "collecting region" will be used to mean the region of the collecting element upon which the sun is focussed during the day, and which is configured to be more highly absorbing of the sun's radiation than regions which are not subject to the focussed radiation of the sun's rays, especially regions which are in thermal contact with the collecting region. Examples of such collecting regions are the darkened strip 29 of FIG. 2 and the darkened strip-like region of FIGS. 3A and 3B.

The concentrating power of a device configured as described above may be readily estimated as follows: let the effective area of the collecting region be called "$A_C$", so that $$A_C = 2\pi r^2(\theta/2 - \theta^2/4)$$

The area of the circular collection aperture of the lens "$A_A$" is $$A_A = \pi r^2$$

where R is the radius of the lens. Therefore, the effective concentrating power "C" of the collector will be $$C = A_A/A_C = (R^2/2r^2)/(\theta/2 - \theta^2/4)$$

For the case of a heavy flint glass sphere where r equals 1.125R, and recalling that $\theta_{annual}$ equals 0.82 radian, $$C \simeq 1.6.$$

Therefore, it is seen that the spherical lens focussing embodiment will have a concentrating power of approximately 2 suns.

Figure 4:
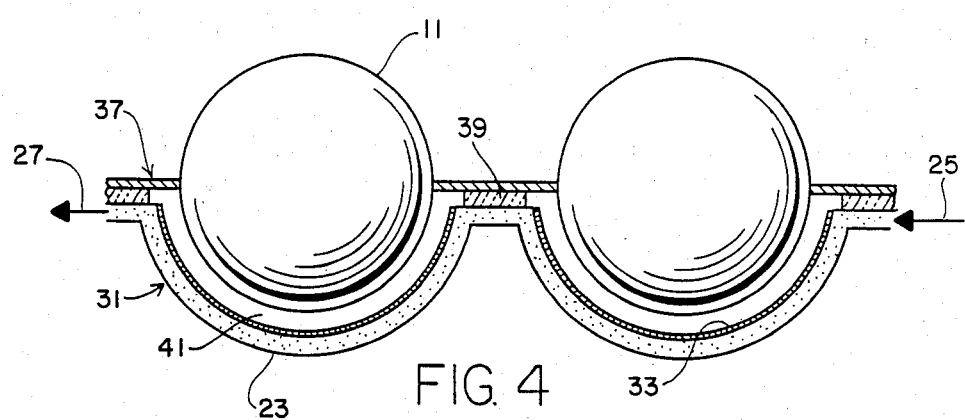
FIG. 4 shows a cross-section of several elements of a solar collector shown in FIG. 3.

FIG. 4 illustrates a portion of a solar collector utilizing focussing spheres 11 and collecting cups 31 to form an array of solar collectors. While only two elements of the array are illustrated in FIG. 4, it will be evident to those skilled in the art that a two-dimensional array may be formed utilizing the basic structure shown in FIG. 4. In particular, the use of collecting cups provides a convenient mechanism for positioning each focussing sphere relative to an associated collecting strip. Thus, in FIG. 4, a focussing sphere 11 is attached to a support bracket 37 which is attached to a collecting cup 31. A conduit 23 is affixed to the bottom of cup 31, adjacent to, and in thermal contact with, collecting strip 33. Conduit 23 is thermally insulated from the rest of the structure by means of insulating blocks 39. In an array of collectors, collecting conduit 23 will extend continuously from one collecting cup to another, so that the working fluid entering at port 25 and exiting at port 27 will pass beneath the collecting strips of each cup, being heated by the concentrated rays of the sun from each lens during its passage through the collecting tube. The use of collecting cups provides the additional advantage that a vacuum region 41 may be formed between lens 11 and collecting cup 31. This is advantageous in that it reduces thermal leakage by preventing the convective conduction of heat from the cup to the lens.

Figures 5A, 5B, 6:
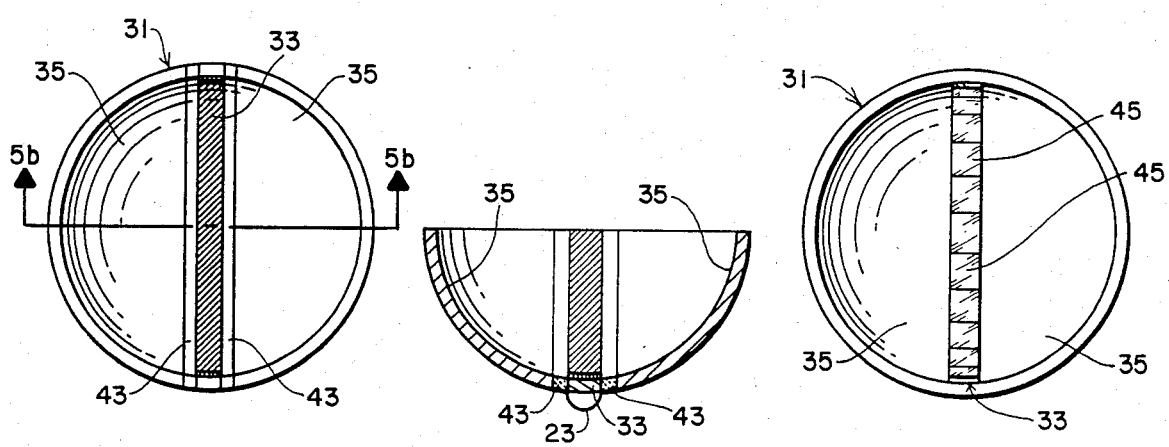
FIGS. 5A and 5B illustrate two views of a collecting cup in which a collecting strip is thermally insulated from the remainder of the cup.
FIG. 6 illustrates a top view of a collecting cup in which a linear array of solar cells lines a portion of a collecting cup.

In FIGS. 5A and 5B, the collecting region 33 of a collecting cup 31 is thermally insulated from adjacent regions 35 of the collecting region 33. Insulating strips 43 are preferably fabricated from a ceramic or glass having a high thermal resistance and prevent or substantially reduce the transfer of heat collected by collecting region 33 to the remainder of the collecting cup. This configuration further minimizes re-radiation of collected heat, insuring maximum efficiency of the transfer of the collected heat to the working fluid in a conduit 23 underlying collecting region 33.

Figure 7:
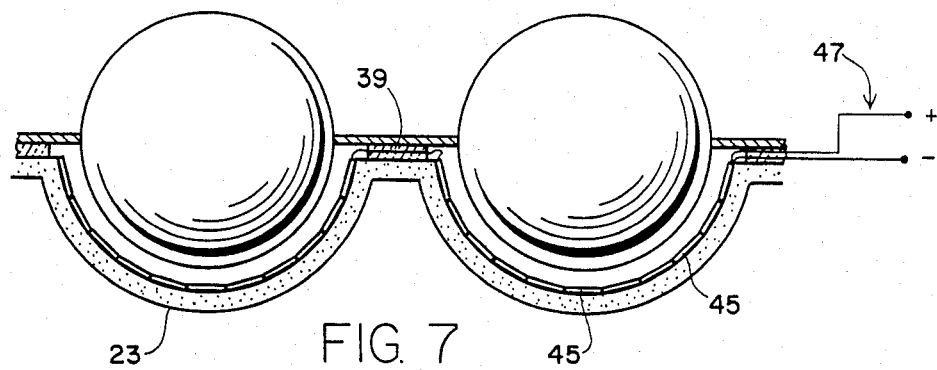
FIG. 7 shows a cross-sectional view of the collecting cup of FIG. 6 used in conjunction with spherical lens.

In the embodiment shown in FIG. 6, a collecting cup 31 includes a strip-like collecting region 33 along which is located a linear array of solar cells, for direct conversion of the focussed solar radiation into electricity. The solar cells may be of various types commonly available, such as a gallium arsenide cell, or a silicon cell. A particular advantage of this embodiment of the invention is that many solar cells become more efficient at increasing light intensities, such as the intensity resulting from the solar focussing according to the invention. An additional advantage of this embodiment is illustrated in FIG. 7, in which the linear array of solar cells 45 is used both to generate direct electrical power, and also to heat a working fluid. This is possible because the focussed rays of the sun will heat the solar cells to their operating temperature of about 150° C., which heat may be transferred to a working fluid in a conduit 23 positioned under the linear array of solar cells. Thus, in this embodiment both the heated working fluid and the voltage produced by the solar cells (appearing at terminals 47) are available as energy sources.

Figure 8:
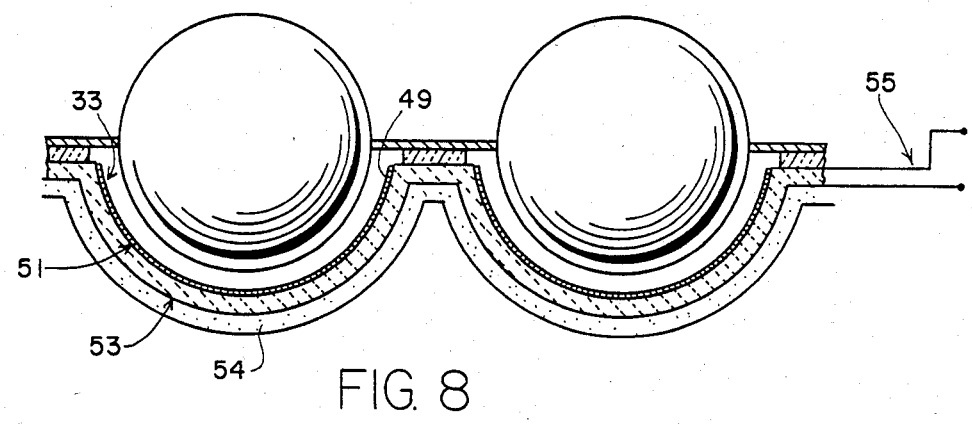
FIG. 8 shows a portion of a solar collector in which a spherical lens focusses the sun's radiation upon a thermoelectric or thermoionic converter.

In yet another embodiment of the invention shown in FIG. 8, a dark absorptive coating 49 is placed along a strip-like collecting region 33 of a collecting cup having a metallic inner surface 51 functioning as the anode of a thermoelectric or thermoionic converter. The bottom surface 53 is cooled by a coolant flowing in a conduit 54 and functions as a cathode of the converter. In operation, a temperature differential between anode and cathode will be established, producing an electrical voltage at output terminal 55.

Figure 9:
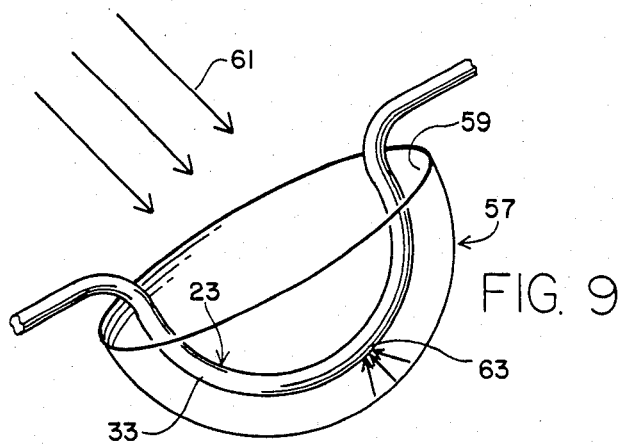
FIG. 9 illustrates a reflecting mirror focussing the sun's radiation upon a conduit positioned upon the focussing circle of the mirror.

In FIG. 9, there is illustrated an embodiment of the invention in which a hollow hemisphere 57 having a highly reflective inner surface 59, for example, of highly polished aluminum, acts as a concave spherical mirror focussing the sun's rays 61 onto a spot 63 on the underside 33 of a conduit 23 through which flows a working fluid. Conduit 23 is semi-circular in shape, having a center co-incident with the center of the reflecting sphere, so that as the sun's rays 61 impinge on reflecting sphere 57 at different times of the day, focussing spot 63 will traverse collecting region 33. As in other embodiments of the invention, the underside of conduit 23 is preferably made highly absorptive of the sun's radiation, for example, by coating with a darkened substance such as carbon black.

The concentrating power of this mirror embodiment may be calculated using the formulas earlier defined for the lens embodiment, while noting that for the case of a spherical mirror, r=1/2R. Thus, $$C \simeq 8.$$

Thus, the ideal concentrating power of this embodiment is about 18 suns (compared to 1.8 suns for the lens embodiments). However, for other reasons, such as effects of internal reflections, correction losses, collector shadowing by support elements, etc., the practical concentrating power of the spherical lens embodiment will be somewhere within the range of 1.25 to 2.5 suns and that of the mirror embodiment within the range of 5 to 10 suns.

These concentrating powers may be increased in direct proportion to the number of times during a year it would be permissible to move the collector. For example, if the collector can be repositioned once every six months, the collector strip area may be reduced by approximately a factor of two, thereby increasing the concentrating power of the spherical lens embodiment to 2 to 4 suns and that of the mirror embodiment to 8 to 13 suns.

The choice of which embodiment to employ depends upon the desired application. For example, in especially cloudy regions, the effectiveness of the collector under diffused light conditions becomes important. In such an application, the spherical lens embodiment would be preferred since its concentrating power would drop to approximately ½ sun, where as that of the mirror embodiment would drop to approximately 1/10 sun.

In accordance with yet another aspect of the invention, the collecting element may be fabricated from a material having non-linear absorbing properties as a function of the intensity of radiation incident thereon; such a material is the photochromic glass presently used in the manufacture of certain types of sun glasses, available from the Corning Glass Co., which has the property of becoming darker when impinged upon by sunlight. In preferred embodiments, the collecting cup 31 of FIG. 3 may be fabricated in its entirety, or alternatively only along the collecting region 33 from such a photochromic glass. When the rays of the sun are converged by lens 11 on a small spot lying along collecting region 33, that spot will become much darker than the remainder of the collecting cup and thereby absorb the sun's radiation at a much higher rate than the remainder of the collecting cup. As the sun traverses the sky, different portions of collecting region 33 will become dark. Thus, the nonlinearity in absorption of the sun's rays by the photochromic glass is exploited to provide the collecting region of the device. A similar structure may be achieved in the context of FIG. 2, in which case the top surface of conduit 23 may be fabricated from the photochromic glass as well as in the contexts of FIGS. 5 or 9. The embodiments of the invention utilizing such a non-linear absorbing material are even more efficient solar collectors than those earlier described, since at any given time only a small spot of the collecting region is, in fact, more highly absorbing (and, hence, emitting) than the remainder of the collector. It should be noted that the use of such a non-linear absorbing material would also be advantageous in many other solar collectors in which solar radiation is focussed on a collecting element, even where the structure as a whole did not provide the additional advantages of the various embodiments disclosed herein.

As an alternative to the non-linear absorption of the above described photochromic glass, other properties which are non-linear as a function of solar flux or temperature may also be exploited in connection with the invention. For example, certain materials, e.g. most glasses and some semiconductors, become good conductors of heat at elevated temperatures, whereas they are poor heat conductors at lower temperatures. Thus, the collecting cup 31 (or the collecting region 33) may be lined with such a material, then only the focal spot will become hot enough to lower the thermal resistance to the point where the heat would readily be transferred to and from the working fluid of the collector. The remaining regions of the collector would be at a lower temperature, and hence could not readily transfer any heat to be lost as re-radiation from the collector. Note that the photovoltaic array previously discussed displays a related property, since the conversion of solar flux to electricity is more efficient at the higher solar concentration incident on the particular cell which is illuminated at any given time of day.

Figure 10:
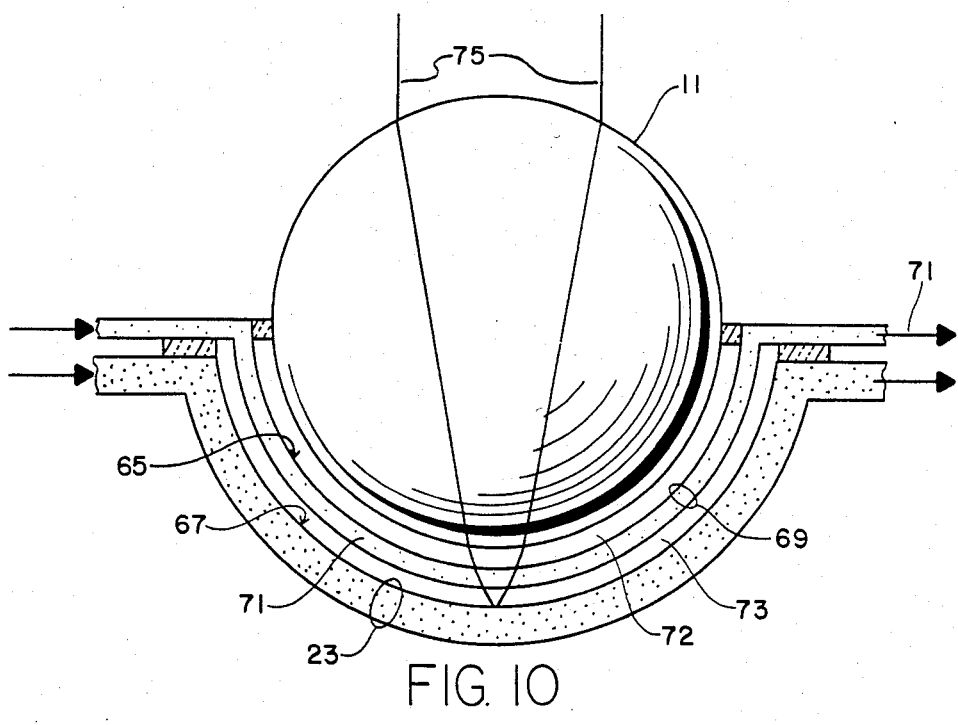
FIG. 10 shows a solar collector utilizing two types of photochromic glass.

Another embodiment utilizing photochromic glass or the like is shown in FIG. 10. In this embodiment, a secondary layer of photochromic glass 65 is positioned between the focussing element 11 and a primary layer 67 of photochromic glass. However, unlike primary glass layer 67 which darkens with increasing light intensities, second layer 65 is nominally dark in low light intensities, while becoming transparent with increasing light intensities. The properties of both layers are selected such that in diffuse light conditions (when the light intensity is too low to cause the primary layer to darken), the secondary layer remains dark, and therefore absorbs the solar radiation. The concentrating power of the collector would be "1" under such conditions, as opposed to virtually zero in the single layer embodiment under similar conditions. Since the light collection takes place in two different regions determined by direct or diffuse solar lighting conditions, two different heat transport systems are preferred for optional operation. The first, or low temperature system, would use a transparent collecting shell 69 in direct thermal contact with secondary photochromic layer 65. Inside tube 69 circulates a transparent heat transferring fluid 71 (gas or liquid). The second, or high temperature system, uses a collecting tube 23 and fluid as described above in connection with earlier embodiments. The primary and secondary photochromic glass regions are separated from each other and from lens 11 by vacuum regions 71 and 73, respectively. For optimal performance, incoming solar rays 75 should be focussed upon photochromic layer 67 by the combination of lens 11 and the effective "lens" formed by photochromic glass 65, tube 69, and fluid 71. This embodiment of the invention may be employed in circumstances requiring that the solar energy system function at least as well as a flat plate collector under diffuse light conditions.

Figure 11A:
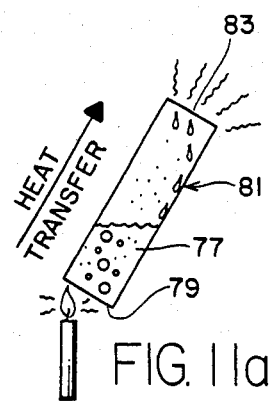
FIGS. 11A and 11B schematically illustrate the use of a unidirectional heat pipe in which heat may be transferred in one direction only.
Figure 11B:
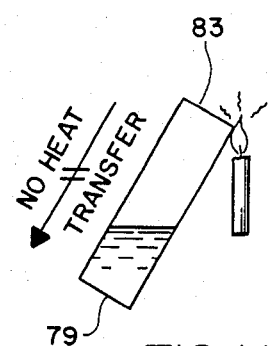
Figure 12:
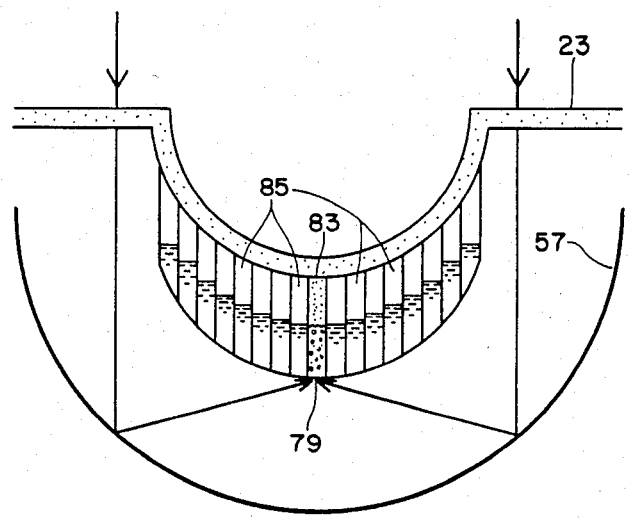
FIG. 12 illustrates a solar collector in which an array of unidirectional heat pipes is subjected to the focussed radiation of the sun.

Yet other embodiments are available in which the collecting element is fabricated from a device or devices having non-linear heat transfer properties. One such device is known as a heat pipe and transfers heat readily and efficiently in one direction only. FIGS. 11A and 11B show such a device in which a fluid 77 is located at a collector end 79 of a tube 81. When the fluid is heated to its boiling point, it evaporates, travels to a transfer end 83 of pipe 81, and there condenses; heat has therefore been transferred from collector end 79 to transfer end 83. However, if heat is applied to end 83, no heat will be transferred in the reverse direction, since there is no fluid gathered at end 83 to be evaporated; this condition is shown in FIG. 11B.

Such a heat pipe may be utilized in the present invention as shown in FIG. 11, where an array of heat pipes 85 are positioned with their transfer ends adjacent a collecting tube 23. A hemispherical mirror 57 focusses the sun's rays onto a small region of the heat pipe array. The collector end of each heat pipe is thermally insulated from its neighbor in the array so that only the illuminated pipe (or pipes) becomes hot enough to boil the working fluid contained therein. The resulting vapor condenses on the transfer end 83 of the heat pipe, thereby giving up heat to the working fluid of the collector in conduit 23. The condensed fluid then flows back down to the collector end 79 to repeat the process. Now, even though the transfer ends of all pipes are in mutual thermal contact (through conduit 23), heat cannot flow from the transfer ends of the non-activated pipes to their collector ends. Therefore, the collector ends of the non-illuminated heat pipes cannot be heated and hence cannot radiate away the collected solar energy. Thus, without any moving parts, the working fluid in conduit 23 can be heated to a very high temperature as efficiently as a conventional focussing solar collector that mechanically tracks the sun.

Figure 13:
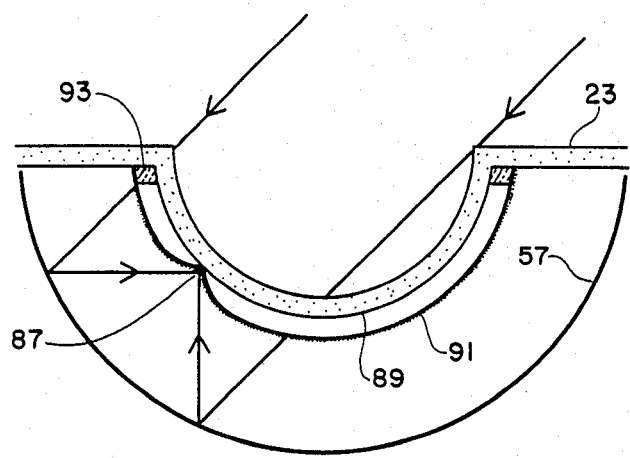
FIG. 13 shows a solar collector in which the focussed solar radiation induces dimpling of a mechanical element resulting in local heat transfer.

A collector according to aspects of the invention, having non-linear heat transfer properties may also be constructed using mechanical means as shown in FIG. 13. Again, a hemispherical mirror 57 focusses the sun's light onto different local spots 87 at different times during the day. In this embodiment two strips of metal 89 and 91 are held apart by a thermally insulating material 93. Strip 89 is in contact with the working fluid in conduit 23 and is a good thermal conductor. Strip 91 is constructed of a flexible material that is a poor thermal conductor such as a very thin strip of stainless steel or nitinol, a metal with mechanical memory. The side of the strip 91 facing mirror 57 is coated with an absorptive coating. The space between the two strips should be a relatively good vacuum to prevent heat conduction across the gap. Strip 91 is mechanically stressed such that when a localized region 87 is heated, the strip "dimples" inward until it touches strip 89. At the point 87 where the strips touch, a thermal bridge is formed, increasing dramatically the thermal conductivity from the heated strip 91 to the opposite strip 89 in thermal contact with the working fluid in conduit 23.

The zone of local heating will therefore follow the focal spot 87 as the sun moves across the sky. By construction, the thermal gradients will move the "dimple" in such a manner that it will always be located in the hottest zone, i.e., the focus of the collector. In this way, the region of highest thermal conductivity would track the focal zone of the solar radiation.

Because of the interspatial vacuum, very little heat will flow back from the working fluid to regions of outer strip 91 other than the local spot 87. To facilitate heat transfer at the point of contact, as well as to provide some lubrication, the interior sides of the strips could be coated with some material such as mercury.

I claim:

1. A device for collecting solar radiation comprising:
   collecting means for conversion of solar radiation to another form of energy, said collecting means having a collecting region which is more highly absorptive of solar radiation when the radiation is focussed there than other regions of said collecting means where the radiation is not focussed;
   focussing means positioned in spacial relationship with said collecting means for focussing solar radiation on said collecting region at all times of day, without necessitating motion during said day of said focussing means or said collecting means;
   mechanical heat transferring means spaced apart from said collecting means for moving into contact with said collecting means in an area of contact in said collecting region where radiation is focussed and in response to said focussed radiation, said area of contact moving continuously and maintaining uninterupted contact between said mechanical heat transferring means and said collecting means during the day as the sun moves.

2. A device for collecting solar radiation comprising:
   conduit means for containing a working fluid;
   a mechanical heat transferring element spaced apart from said conduit means at a first point and a second point and being an integral unit between said first point and said second point;
   focussing means for focussing solar radiation on said mechanical heat transferring element at all times of day without necessitating motion during said day of said focussing means or said conduit means;
   said mechanical heat transferring element dimpling into contact with said conduit means at a third point located at any point on said integral point between said first point and said second point from thermal expansion when said solar radiation is focussed on said third point.

3. A device as in claim 2 wherein said third point moves continuously in response to the motion of the sun during the day.

4. A device as in claim 3 wherein said focussing means comprises a hemispheric mirror having an inner reflecting surface.

5. A device as in claim 4 wherein said mechanical heat transferring element is comprised of a material that is a poor thermal conductor.

6. A device as in claim 5 wherein said conduit means further comprises a strip of material which is a good thermal conductor in contact with said working fluid, and which is disposed between said mechanical heat transferring element and said working fluid, and wherein said strip is located where said mechanical heat transfer element dimples into contact with said conduit means.

7. A device as in claim 6 wherein a vacuum exists between said mechanical heat transferring element and said conduit means.

8. A device as in claim 7 wherein said heat transferring element is disposed between said conduit means and said focussing means and has two sides, one facing said conduit means and one facing the focussing means, said side facing said focussing means having a coating for absorbing solar radiation.

9. A device as in claim 8 wherein the side of said heat transferring means facing the conduit means has a fluid thereon for promoting heat transfer.

10. A device as in claim 9 wherein said fluid for promoting heat transfer comprises mercury.

11. A device as in claim 5 wherein said material that is a poor thermal conductor comprises stainless steel.

12. A device as in claim 5 wherein said material that is a poor thermal conductor comprises a metal with a memory.

* * * * *